(12) United States Patent  
Jung et al.

(10) Patent No.: US 10,190,913 B2  
(45) Date of Patent: Jan. 29, 2019

(54) SUBSTRATE PROCESSING APPARATUS AND METHOD

(71) Applicant: ZEUS CO., LTD., Osan-si, Gyeonggi-do (KR)

(72) Inventors: Kwang Il Jung, Yongin-si (KR); Byeong Su Lee, Osan-si (KR); Joo Hyung Ryu, Seoul (KR)

(73) Assignee: ZEUS CO., LTD., Osan-si, Gyeonggi-Do (KR)

( * ) Notice: Subject to any disclaimer, the term of this patent is extended or adjusted under 35 U.S.C. 154(b) by 0 days.

(21) Appl. No.: 15/329,020

(22) PCT Filed: Aug. 27, 2015

(86) PCT No.: PCT/KR2015/009001  
§ 371 (c)(1),  
(2) Date: Jan. 25, 2017

(87) PCT Pub. No.: WO2017/034057  
PCT Pub. Date: Mar. 2, 2017

(65) Prior Publication Data  
US 2018/0156665 A1 Jun. 7, 2018

(51) Int. Cl.  
*H01L 21/66* (2006.01)  
*G01J 5/00* (2006.01)  
(Continued)

(52) U.S. Cl.  
CPC ........... *G01J 5/0007* (2013.01); *G01J 5/0846* (2013.01); *G01J 5/522* (2013.01); *G01J 5/60* (2013.01);  
(Continued)

(58) Field of Classification Search  
None  
See application file for complete search history.

(56) References Cited

U.S. PATENT DOCUMENTS

| | | | |
|---|---|---|---|
| 2004/0023421 A1 | 2/2004 | Shibata et al. | |
| 2010/0290500 A1 | 11/2010 | Zettler et al. | |
| 2012/0024222 A1* | 2/2012 | Svensson | C30B 23/002 117/86 |

FOREIGN PATENT DOCUMENTS

| | | |
|---|---|---|
| JP | 2004-117203 | 4/2004 |
| JP | 2011-211092 | 10/2011 |

(Continued)

OTHER PUBLICATIONS

International Search Report for International Application No. PCT/KR2015/009001 with English translations, dated May 23, 2016.  
(Continued)

*Primary Examiner* — Asok K Sarkar  
(74) *Attorney, Agent, or Firm* — Kile Park Reed & Houtteman PLLC

(57) ABSTRACT

Disclosed are a substrate processing apparatus and a substrate processing method. The substrate processing apparatus includes an emissivity setting unit to which emissivity at a liquid chemical which is brought into contact with a substrate or emissivity at an interface at which the substrate and the liquid chemical are in contact with each other is input, a radiant energy input unit to which radiant energy radiating from the liquid chemical or the interface is input, and a calculation unit that calculates a calculation temperature of the liquid chemical or the interface based on the emissivity and the radiant energy.

12 Claims, 10 Drawing Sheets

(51) Int. Cl.
*H01L 21/302* (2006.01)
*G01J 5/08* (2006.01)
*G01J 5/52* (2006.01)
*G01J 5/60* (2006.01)
*H01L 21/67* (2006.01)
*B08B 7/00* (2006.01)

(52) U.S. Cl.
CPC ........ *H01L 21/302* (2013.01); *H01L 21/6715* (2013.01); *H01L 21/67063* (2013.01); *H01L 21/67098* (2013.01); *H01L 22/12* (2013.01); *B08B 7/0035* (2013.01)

(56) References Cited

FOREIGN PATENT DOCUMENTS

| | | |
|---|---|---|
| JP | 2013-525767 | 6/2013 |
| JP | 2013-234984 | 11/2013 |
| JP | 2015-087112 | 5/2015 |
| KR | 10-2008-0020720 | 3/2008 |
| KR | 10-0876539 | 12/2008 |
| KR | 10-2010-0122465 | 11/2010 |
| KR | 10-1037179 | 5/2011 |
| KR | 10-2011-0138790 | 12/2011 |
| WO | 2006/103773 | 10/2006 |

OTHER PUBLICATIONS

Written Opinion for International Application No. PCT/KR2015/009001 with English translations, dated May 23, 2016.

\* cited by examiner

SUBSTRATE PROCESSING APPARATUS AND METHOD

TECHNICAL FIELD

The present invention relates to a substrate processing apparatus and method, and more particularly, to a substrate processing apparatus and method, which may optimize the processing temperature of a substrate depending on a liquid chemical by directly measuring the calculation temperature of the liquid chemical or the calculation temperature of an interface at which the liquid chemical and the substrate are in contact with each other.

BACKGROUND ART

In general, a wet process corresponds to a process in which processing such as etching or cleaning is performed on the surface of a substrate such as a silicon wafer or the like by bringing a liquid chemical into contact with the substrate.

Specifically, the wet process may include an etching process which may form a thin film or a layer on the substrate by bringing liquid chemical into contact with the substrate. In addition, the wet process may include a cleaning process which may clean the thin film or the layer formed on the substrate by bringing the liquid chemical into contact with the substrate, or remove contaminants or the like formed on the substrate.

Meanwhile, as the degree of integration of semiconductor devices have been enhanced in the semiconductor field, the pattern formed on the substrate is micronized to several tens of nm level, and therefore the importance of the etching process and the cleaning process has increased.

Thus, it is the actual situation that a part of a batch type wet process which has been kept for decades due to its high productivity is replaced by a single wafer type wet process. However, in the conventional wet process, it is difficult to accurately measure or maintain the temperature of the liquid chemical or the substrate as a set temperature, and therefore there is a difficulty in ensuring the uniformity of substrate processing. Therefore, there is a need for improving this.

The background art of the invention is disclosed in Korean Patent Application No. 10-1037179 (registered on May 19, 2011, title of the invention: apparatus and method for checking of temperature controller).

DISCLOSURE

Technical Problem

The present invention is directed to providing a substrate processing apparatus and method, which may optimize the processing temperature of a substrate depending on a liquid chemical by directly measuring the calculation temperature of the liquid chemical which is brought into contact with the substrate or the calculation temperature of an interface at which the substrate and the liquid chemical are in contact with each other in a substrate processing process such as a single wafer type wet etching or cleaning for processing the surface of the substrate using the liquid chemical.

Technical Solution

According to an aspect of the present invention, there is provided a substrate processing apparatus including: an emissivity setting unit to which emissivity at a liquid chemical which is brought into contact with a substrate or emissivity at an interface at which the substrate and the liquid chemical are in contact with each other is input; a radiant energy input unit to which radiant energy radiating from the liquid chemical or the interface is input; and a calculation unit that calculates a calculation temperature of the liquid chemical or the interface based on the emissivity and the radiant energy.

Here, the substrate processing apparatus may further include a chamber that includes a table that is rotatably disposed, a support that supports the substrate in such a manner that the substrate is spaced apart from the table, and a nozzle that supplies the liquid chemical to the substrate.

Also, the nozzle may be separately arranged on a lower side of the substrate.

Also, the calculation unit may calculate the calculation temperature using an absolute temperature calculated according to the following Equation 3.

$$E(\lambda, T) = \frac{\varepsilon C_1}{\lambda^5 \left(e^{\frac{C_2}{\lambda T}} - 1\right)} \quad \text{[Equation 3]}$$

where $$C1 = 2\pi hc^2 = 3.74 \times 10^{-16} \text{ W/m}^2$$

is satisfied and $$C2 = \frac{hc}{k} = 1.44 \times 10^{-2} \text{ mK}$$

is satisfied, and E ($\lambda$,T) denotes the radiant energy input to the radiant energy input unit, $\lambda$ denotes an infrared wavelength set in advance according to the radiant energy input unit, $\varepsilon$ denotes the emissivity at the liquid chemical or the interface, T denotes the absolute temperature, h denotes a Plank constant, c denotes a speed of light, and k denotes a Boltzmann constant.

Also, a pyrometer may include the emissivity setting unit, the radiant energy input unit, and the calculation unit so as to measure the calculation temperature, and may be provided in an installation portion that is separately arranged on an upper side of the substrate.

Also, the substrate processing apparatus may further include a protection unit that wraps and protects the radiant energy input unit.

Also, the radiant energy input unit may be provided to be spaced apart from the substrate on an opposite side in which the interface is positioned with respect to the substrate.

Also, the substrate processing apparatus may further include a control unit that compares a process temperature set in advance to etch or clean the substrate and the calculation temperature.

Also, the substrate processing apparatus may further include a heater that is separately arranged on an upper side of the substrate, and heats the substrate or the liquid chemical which is brought into contact with the substrate, according to a signal of the control unit.

Also, the substrate may be divided into a central region corresponding to a rotational center portion of the table, an edge region corresponding to an edge portion caused by the rotation of the table, and a variable region for partitioning between the central region and the edge region, the radiant energy input unit and the heater may be respectively arranged in the central region, the edge region, and the variable region, and the control unit may individually operate the heater in the central region, the edge region, and the variable region.

According to another aspect of the present invention, there is provided a substrate processing method including: measuring radiant energy radiating from a liquid chemical which is brought into contact with a substrate or from an interface at which the substrate and the liquid chemical are in contact with each other; and calculating a calculation temperature of the liquid chemical which is brought into contact with the substrate or a calculation temperature of the interface based on the radiant energy measured in the measuring and emissivity at the liquid chemical or the interface.

Here, the calculating may calculate the calculation temperature using an absolute temperature T calculated according to the following Equation 4.

$$E(\lambda, T) = \frac{\varepsilon C_1}{\lambda^5 \left(e^{\frac{C_2}{\lambda T}} - 1\right)}$$ [Equation 4]

where $$C1 = 2\pi hc^2 = 3.74 \times 10^{-16} \text{ W/m}^2$$

is satisfied and $$C2 = \frac{hc}{k} = 1.44 \times 10^{-2} \text{ mK}$$

is satisfied, and E ($\lambda$,T) denotes the radiant energy measured in the measuring, $\lambda$ denotes an infrared wavelength set in advance according to a radiant energy input unit to which the radiant energy is input, $\varepsilon$ denotes the emissivity at the liquid chemical or the interface, T denotes the absolute temperature, h denotes a Plank constant, c denotes a speed of light, and k denotes a Boltzmann constant.

Also, the substrate processing method may further include comparing a process temperature set in advance so as to etch or clean the substrate and the calculation temperature calculated in the calculating.

Also, when the calculation temperature is included in the process temperature set in advance in the comparing, the measuring may be performed.

Also, when the calculation temperature is not included in the process temperature set in advance in the comparing, the substrate processing method may further include heating the substrate or the liquid chemical which is brought into contact with the substrate for correction according to a difference value between the calculation temperature and the process temperature set in advance.

Advantageous Effects

The substrate processing apparatus and the substrate processing method according to the present invention may directly measure the calculation temperature of the liquid chemical which is brought into contact with the substrate in the single wafer type wet etching or cleaning process or the calculation temperature of the interface at which the substrate and the liquid chemical are in contact with each other, thereby optimizing the processing temperature of the substrate according to the liquid chemical.

In addition, according to the present invention, by directly measuring the temperature of the liquid chemical which is brought into contact with the substrate or the temperature of the interface, it is possible to accurately and efficiently manage the processing temperature of the substrate, thereby eliminating processing imbalance of the substrate or the like due to the overheating of the substrate (overheating of the substrate caused by heating the substrate or the liquid chemical).

In addition, according to the present invention, by accurately controlling a change in the processing temperature of the substrate which occupies a large part in the single wafer type wet etching process, it is possible to accurately and efficiently manage the processing temperature of the substrate.

In addition, according to the present invention, as the degree of integration of the pattern is increased, high processing reproducibility and precision may be realized in the wet process equipment, particularly, the single wafer type wet etching or cleaning process equipment.

In addition, according to the present invention, the temperature distribution change within the substrate may be determined in real time, and therefore the occurrence of a defect in the etching or cleaning process may be immediately recognized, the determined temperature distribution change may be utilized as a basis for determining the cause of a reduction in the yield, and therefore the process defects may be predicted.

In addition, according to the present invention, when the liquid chemical in a state of being heated is supplied to the substrate, it is possible to fully compensate for the cooling of the liquid chemical, ensure the accurate processing condition in the single wafer type wet etching or cleaning process, and achieve the standardization of the single wafer type wet etching or cleaning process.

In addition, the present invention may be applied to the substrate having a large area, and therefore the processing temperature of the entire substrate may be maintained substantially uniform.

In addition, according to the present invention, the calculation temperature may be measured on the opposite surface to the interface at which the substrate and the liquid chemical are in contact with each other, and therefore it is possible to suppress or prevent the scattering and interference of light with respect to the liquid chemical.

In addition, according to the present invention, the substrate or the liquid chemical may be heated on the opposite surface to the interface at which the liquid chemical is brought into contact with the substrate, and therefore it is possible to suppress or prevent the liquid chemical from being evaporated or the concentration of the liquid chemical from being changed in a process in which the liquid chemical is brought into contact with the substrate.

In addition, according to the present invention, the substrate or the liquid chemical may be heated after the liquid chemical of room temperature is supplied to the substrate, and therefore it is possible to suppress or prevent the concentration or composition of the liquid chemical from being changed.

MODES OF THE INVENTION

Hereinafter, a substrate processing apparatus and method according to embodiments of the present invention will be described in detail with reference to the accompanying drawings.

The thickness and size of the components of the lines shown in the figure in this process may have been exaggerated for convenience and clarity of description. The described below is defined considering functions in the present invention and may vary according to a user's or operator's intention or usual practice. Thus, the meanings of the terminology should be interpreted based on the overall context of the present specification.

Figure 1:
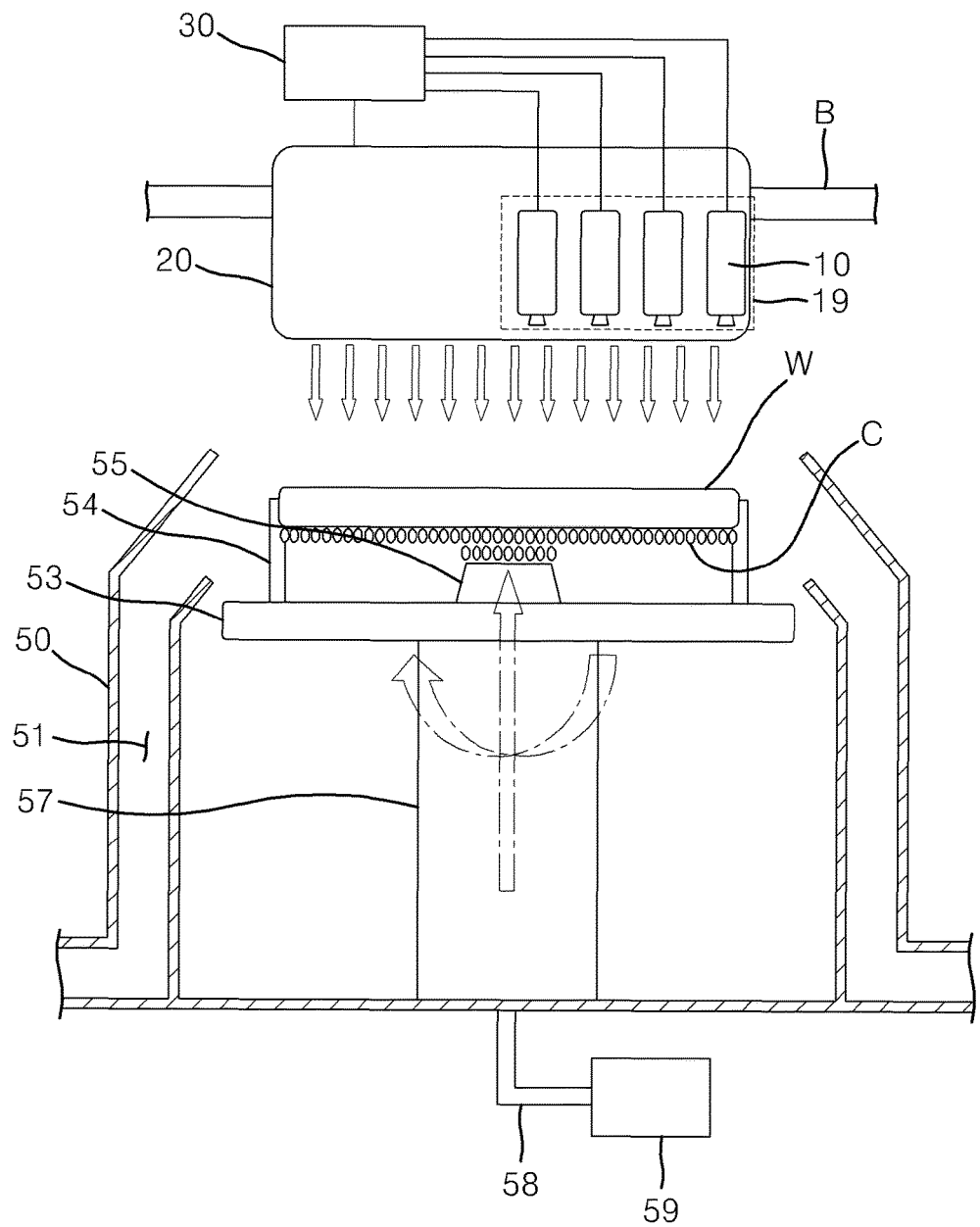
FIG. 1 illustrates a substrate processing apparatus according to an embodiment of the present invention.
Figure 2:
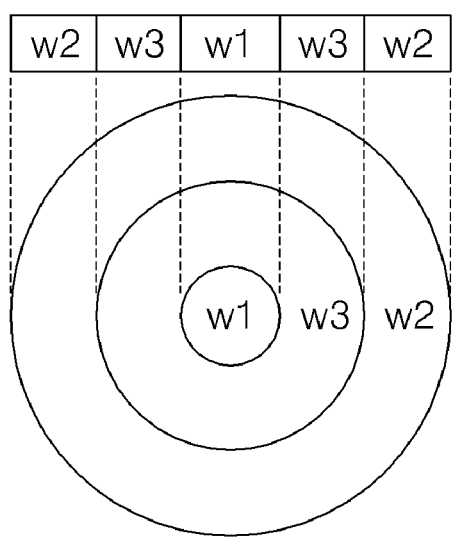
FIG. 2 illustrates a substrate in a single wafer type wet etching or cleaning process according to an embodiment of the present invention.
Figure 3:
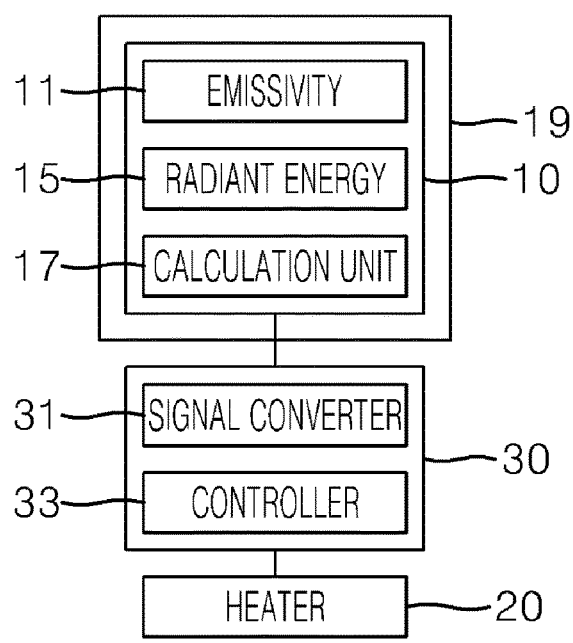
FIG. 3 is a first configuration diagram illustrating a substrate processing apparatus according to an embodiment of the present invention.
Figure 4:
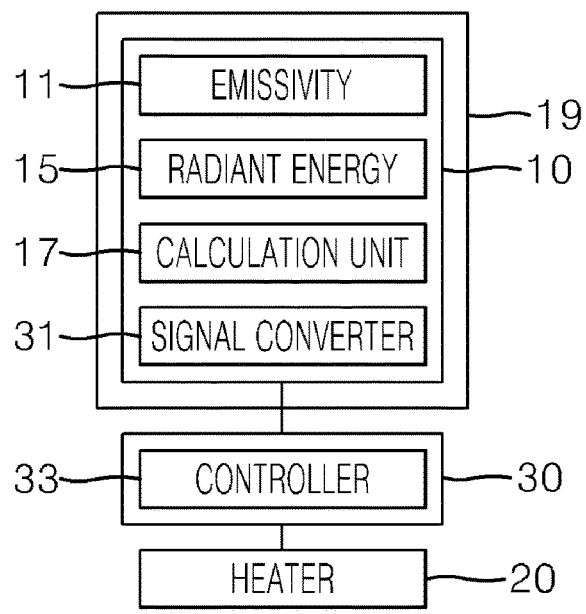
FIG. 4 is a second configuration diagram illustrating a substrate processing apparatus according to an embodiment of the present invention.
Figure 5:
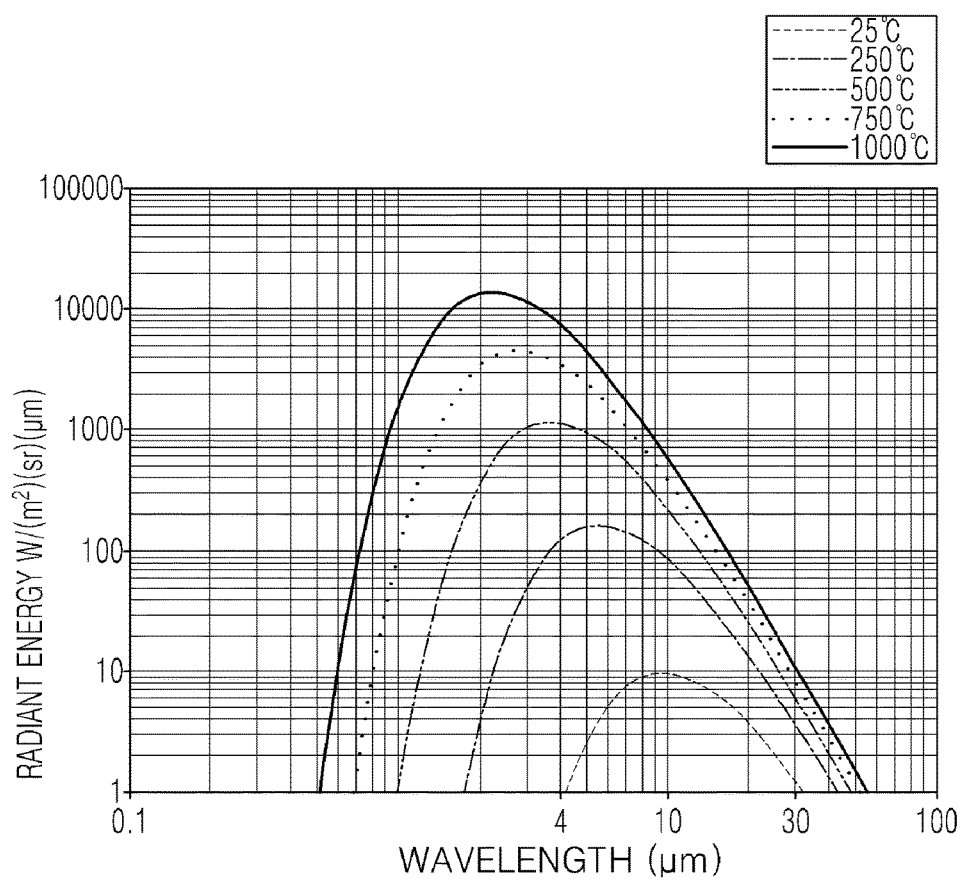
FIG. 5 is a graph illustrating an infrared wavelength range in which radiant energy is measured depending on a temperature change in a substrate processing apparatus according to an embodiment of the present invention.

FIG. 1 illustrates a substrate processing apparatus according to an embodiment of the present invention, FIG. 2 illustrates a substrate in a single wafer type wet etching or cleaning process according to an embodiment of the present invention, FIG. 3 is a first configuration diagram illustrating a substrate processing apparatus according to an embodiment of the present invention, FIG. 4 is a second configuration diagram illustrating a substrate processing apparatus according to an embodiment of the present invention, and FIG. 5 is a graph illustrating an infrared wavelength range in which radiant energy is measured depending on a temperature change in a substrate processing apparatus according to an embodiment of the present invention.

Referring to FIGS. 1 to 5, a substrate processing apparatus according to an embodiment of the present invention may include an emissivity setting unit 11, a radiant energy input unit 15, a calculation unit 17, and a chamber 50, and thereby may optimize the processing temperature of a substrate W depending on a liquid chemical C.

Here, in a single wafer type wet process, a single sheet of the substrate W is seated on a support 54, and the substrate W is rotated through a diffusion unit 57. The liquid chemical C which has been moved via a liquid chemical line 58 from at least one liquid chemical tank 59 is supplied to the surface of the substrate W from a nozzle 55 corresponding to the liquid chemical tank 59 according to a predetermined sequence.

In such a single wafer type wet process, the processing result may vary depending on a contact time, an amount, and a temperature of the liquid chemical C. By way of an example, in a case in which the processing time is reduced or a temperature above room temperature is required according to the characteristics of the process, the liquid chemical C is heated in the liquid chemical tank 59, and the heated liquid chemical C may be supplied to the substrate W. By way of another example, in a case in which a mixture solution is used as the liquid chemical C, chemical reaction heat may be used.

The substrate processing apparatus according to an embodiment of the present invention may measure a calculation temperature of the liquid chemical C which is brought into contact with the substrate W or a calculation temperature of an interface at which the substrate W and the liquid chemical C are in contact with each other, when the liquid chemical C is brought into contact with the substrate W which is rotated in a single wafer type wet etching or cleaning process for etching or cleaning a single sheet of the substrate W using the liquid chemical C supplied from the nozzle 55.

In the emissivity setting unit 11, the emissivity at the liquid chemical C or the interface at which the substrate W and the liquid chemical C are in contact with each other is input. Here, the emissivity is set in advance according to the type of the liquid chemical C.

By way of an example, the emissivity at the liquid chemical C which has been supplied to the substrate W and brought into contact with the substrate W or the interface at which the substrate W and the liquid chemical C are in contact with each other may be separately measured, and the measured emissivity may be input to the emissivity setting unit 11. According to an embodiment of the present invention, the emissivity may be complex emissivity in which energy radiating from the interface at which the substrate W and the liquid chemical C are in contact with each other passes through the substrate W.

The radiant energy input unit 15 is provided in an installation portion B which is separately arranged on an upper side of the substrate W. The radiant energy radiating from the liquid chemical C which is brought into contact with the substrate W or the interface at which the substrate W and the liquid chemical C are in contact with each other is input to the radiant energy input unit 15.

By way of an example, the radiant energy which radiates from the liquid chemical C or the interface in a state in which the liquid chemical C is brought into contact with the substrate W and passes through the substrate W may be input to the radiant energy input unit 15.

The calculation unit 17 calculates the calculation temperature of the liquid chemical C which is brought into contact with the substrate W or the calculation temperature of the interface based on the emissivity input to the emissivity setting unit 11 and the radiant energy input to the radiant energy input unit 15.

The calculation unit 17 may calculate the calculation temperature using an absolute temperature T calculated according to the following Equation 1.

$$E(\lambda, T) = \frac{\varepsilon C_1}{\lambda^5 \left(e^{\frac{C_2}{\lambda T}} - 1\right)} \quad \text{[Equation 1]}$$

In Equation 1, $C1=2\pi hc^2=3.74\times10^{-16}$ W/m² is satisfied, and $$C2 = \frac{hc}{k} = 1.44\times10^{-2} \text{ mK}$$

is satisfied.

Here, E (λ,T) denotes the radiant energy input to the radiant energy input unit 15, λ denotes an infrared wavelength set in advance, ε denotes the emissivity of the liquid chemical C, T denotes the absolute temperature, h denotes a Plank constant, c denotes a speed of light, and k denotes a Boltzmann constant.

Here, by converting the calculated absolute temperature T into degrees Celsius or degrees Fahrenheit, it is possible to accurately measure the calculation temperature.

The infrared wavelength set in advance is a constant set in advance according to the radiant energy input unit 15.

Referring to FIG. 5, all materials including a blackbody emit radiant energy, but peak wavelengths are different from one another depending on the temperature.

The radiant energy emitted from a material follows the plank's law, and the peak wavelengths move to long wavelengths along with a reduction in the temperature.

When the temperature of the liquid chemical C is 25 degrees Celsius, a wavelength capable of measuring radiant energy of 1 W/(m²)(sr)(μm) or more is in a range of more than 4 μm and 30 μm or less, and the peak wavelength is 10 μm.

Here, it is difficult to measure the radiant energy in the wavelengths of 4 μm or less or more than 30 μm, and therefore the infrared wavelength may be set in advance to be more than 4 μm and 30 μm or less.

More specifically, the infrared wavelength may be set in advance to be 5 μm or more and less than 25 μm. In this instance, the radiant energy of 2 W/(m²)(sr)(μm) or more may be input to the radiant energy input unit 15.

In addition, the infrared wavelength may be set in advance to be 6 μm or more and less than 23 μm. In this instance, the radiant energy of 3 W/(m²)(sr)(μm) or more may be input to the radiant energy input unit 15.

In addition, the infrared wavelength may be set in advance to be 6 μm or more and less than 19 μm. In this instance, the radiant energy of 4 W/(m²)(sr)(μm) or more may be input to the radiant energy input unit 15.

In addition, the infrared wavelength may be set in advance to be more than 6 μm and less than 18 μm. In this instance, the radiant energy of 5 W/(m²)(sr)(μm) or more may be input to the radiant energy input unit 15.

In addition, the infrared wavelength may be set in advance to be 7 μm or more and 17 μm or less. In this instance, the radiant energy of 6 W/(m²)(sr)(μm) or more may be input to the radiant energy input unit 15.

In addition, the infrared wavelength may be set in advance to be 7 μm or more and 16 μm or less. In this instance, the radiant energy of 7 W/(m²)(sr)(μm) or more may be input to the radiant energy input unit 15.

In addition, the infrared wavelength may be set in advance to be 8 μm or more and less than 14 μm. In this instance, the radiant energy of 8 W/(m²)(sr)(μm) or more may be input to the radiant energy input unit 15.

In addition, the infrared wavelength may be set in advance to be 9 μm or more and 11 μm or less. In this instance, the radiant energy of 9 W/(m²)(sr)(μm) or more may be input to the radiant energy input unit 15.

In this instance, a pyrometer 10 may include the emissivity setting unit 11, the radiant energy input unit 15, and the calculation unit 17, and be provided in the installation portion B in order to measure the calculation temperature. The pyrometer 10 may simply calculate the calculation temperature by modularizing the emissivity setting unit 11, the radiant energy input unit 15, and the calculation unit 17 each for measuring the calculation temperature. In the pyrometer 10, an emissivity value, an infrared wavelength, and the like which are suitable for the purpose may be set in advance.

The above-described pyrometer 10 may be provided to be spaced apart from the substrate W at the interface with respect to the substrate W. In this case, it is possible to correct the error of the calculation temperature, which occurs by the scattering and interference of light with respect to the liquid chemical C.

In addition, the above-described pyrometer 10 may be provided to be spaced apart from the substrate W on the opposite surface to the interface with respect to the substrate W. In this case, it is possible to suppress or prevent the error of the calculated calculation temperature by minimizing the influence on the scattering and interference of light with respect to the liquid chemical C, thereby minimizing an error range of the calculation temperature.

The above-described radiant energy input unit 15 or pyrometer 10 is protected in such a manner as to be wrapped by a protection unit 19. The protection unit 19 is provided, and therefore it is possible to prevent the radiant energy input unit 15 or the pyrometer 10 from malfunctioning due to the fume caused by the heating in the liquid chemical C.

The protection unit 19 may be advantageously made of a transmissive material such as a window, a beam pipe, or the like, so that an infrared wavelength may be stably transmitted through the protection unit 19, and the protection unit 19 may prevent the occurrence of the error of the input radiant energy and may not interfere with the ambient temperature.

The substrate processing apparatus according to an embodiment of the present invention may further include a control unit 30 and a heater 20.

The control unit 30 compares a process temperature set in advance in order to perform etching or cleaning on the substrate W and the calculation temperature calculated through the calculation unit 17.

Here, the control unit 30 may include a signal converter 31 that converts the calculation temperature calculated by the calculation unit 17 into analog or digital signals, and a controller 33 that compares a signal of the signal converter 31 and a signal according to the process temperature set in advance and transmits a difference between the two signals. Here, the signal converter 31 may be included in the pyrometer 10.

In addition, the control unit 30 may control the overall operation of the substrate processing apparatus.

The controller 33 may display the signal transmitted from the signal converter 31 as a numerical value or store the signal as data for comparison, so that an operator can recognize the signal. In addition, the controller 33 may determine whether an abnormality in the corresponding process occurs according to the difference between the two signals, and notify the operator of the determination result.

The heater 20 is disposed to be spaced apart from the substrate W, and heats the substrate W or the liquid chemical C which is brought into contact with the substrate W, in response to the signal of the control unit 30. The heater 20 may be provided in the installation portion B.

In addition, the heater 20 may be formed integrally with the radiant energy input unit 15 or the pyrometer 10. The heater 20 may be constituted of an infrared heater and thereby may heat the substrate W.

By heating the substrate W or the liquid chemical C which is brought into contact with the substrate W, the heater 20 may supply the liquid chemical C of room temperature to the substrate W, readily adjust the temperature of the liquid chemical C, and suppress or prevent changes in the composition and concentration of the liquid chemical C, which are caused by the heating in the liquid chemical C.

The control unit 30 operates the heater 20 in response to the calculation temperature measured by the pyrometer 10. The control unit 30 may compare the calculation temperature and the process temperature set in advance for processing the substrate W, and control a heating operation of the heater 20 using a difference value between the calculation temperature and the process temperature set in advance.

By way of an example, when the calculation temperature in the signal of the control unit 30 is included in the process temperature set in advance, it is possible to repeatedly measure the calculation temperature of the liquid chemical C which is brought into contact with the substrate W or the calculation temperature of the interface, through the pyrometer 10.

In addition, when the calculation temperature in the signal of the control unit 30 is not included in the process temperature set in advance, the control unit 30 may raise or lower the output of the heater 20 by transmitting, to the heater 20, a control signal according to the difference value between the calculation temperature and the process temperature set in advance, thereby adjusting the temperature of the substrate W or the liquid chemical C which is brought into contact with the substrate W so that the calculation temperature reaches the process temperature set in advance.

Accordingly, it is possible to stably maintain the processing temperature required for the single wafer type wet etching or cleaning process, and improve the accuracy of the single wafer type wet etching or cleaning process.

In particular, according to an embodiment of the present invention, the process temperature may be kept constant in the wet etching process on the selected or whole substrate W, and thereby it is possible to etch the substrate W by improving the accuracy of a pattern width, a pattern interval, a pattern thickness, and an etching depth according to micro patterns of the substrate W.

In addition, the process temperature may be kept constant in the wet cleaning process, and therefore it is possible to facilitate the penetration of the liquid chemical C between the micro patterns of the substrate W by stably lowering the surface tension according to the liquid chemical C which is brought into contact with the substrate W, prevent the contact between adjacent patterns caused by the surface tension, and prevent the patterns from being deformed or broken by the surface tension.

Consequently, it is possible to stably remove an etching solution or foreign substances which remain between the patterns, and improve the yield in the wet etching or cleaning process.

In addition, even when the liquid chemical C is supplied in a state of room temperature, it is possible to perform etching or cleaning on the substrate W by heating the liquid chemical C of room temperature which is brought into contact with the substrate W. In particular, when using phosphoric acid as the liquid chemical C, the single wafer type wet etching or cleaning process may be performed using the phosphoric acid at the boiling point of the phosphoric acid or higher.

Here, the substrate W may be divided into a central region w1 corresponding to a rotational center portion of a table 53, an edge region w2 corresponding to an edge portion caused by the rotation of the table 53, and a variable region w3 for partitioning between the central region w1 and the edge region w2. A plurality of variable regions w3 may be provided. Then, the radiant energy input unit 15 and the heater 20 may be respectively arranged in the central region w1, the edge region w2, and the variable region w3, and the control unit 30 may individually operate the heater 20 in the central region w1, the edge region w2, and the variable region w3.

The substrate processing apparatus according to an embodiment of the present invention may further include the chamber 50.

The chamber 50 supports the substrate W in such a manner that the substrate W is stably seated on the chamber 50, and supplies the liquid chemical C to the substrate W. The chamber 50 includes the table 53, the support 54, and the nozzle 55.

In the chamber 50, the single wafer type wet etching or cleaning process may be performed, and when processing the substrate W, the supply, etching, cleaning, drying, and the like of the liquid chemical C may be performed without the movement of the substrate W, thereby realizing an inline sequence and automating the wet etching or cleaning process.

When compared to a batch type chamber, such a single wafer type chamber 50 may facilitate the management of the processing statuses of the individual substrates W and the management of the substrates W, prevent the movement of contaminants between the substrates W, and minimize the consumption of the liquid chemical C.

In addition, in the single wafer type chamber 50 when the single wafer type wet etching or cleaning process is performed, the replacement of the liquid chemical C may be conveniently carried out and a new liquid chemical C may be supplied to the individual substrates W every time to thereby facilitate the management of the concentration of the liquid chemical C, when compared to the batch type chamber.

In addition, the single wafer type chamber 50 may secure the processing uniformity of the substrate W in response to the increase in the size of the substrate W, and reduce the manufacturing costs of the chamber 50.

Here, in the batch type chamber, the wet etching or cleaning process may be performed by immersing the substrate W in the liquid chemical C. By way of an example, in the batch type chamber, the wet etching or cleaning process may be performed by immersing, in the liquid chemical C, a cassette (not shown) in which a plurality of substrates W are disposed.

The table 53 is rotatably disposed in the chamber 50. The table 53 is rotated by the diffusion unit 57. The substrate W is rotated through the diffusion unit 57, so that the liquid chemical C is brought into contact with and applied to the substrate W to have a uniform thickness. The diffusion unit 57 may provide injection pressure to the nozzle 55 so that the liquid chemical C may be supplied from the nozzle 55 to the substrate W.

The support 54 may be provided in the table 53, and support the substrate W in such a manner that the substrate W is spaced apart from the table 53. The support 54 may prevent the occurrence of damage such as scratch on the surface of the substrate W by supporting the edge of the substrate W.

The nozzle 55 supplies the liquid chemical C to the substrate W. The nozzle 55 is separately arranged on a lower side of the substrate W. The nozzle 55 may be disposed in the center of rotation of the table 53 and thereby may supply the liquid chemical C to the substrate W. Although not shown, the nozzle 55 may be separately arranged on the upper side of the substrate W, and supply the liquid chemical C to the substrate W while performing a swing motion by a swing means.

However, when the nozzle 55 is provided on the lower side of the substrate W, contaminants generated in the single wafer type wet etching or cleaning process may be easily removed, contamination caused by the scattering of the liquid chemical C may be suppressed, and the consumption of the liquid chemical C may be reduced, compared to when the nozzle 55 is provided on the upper side of the substrate W.

In this instance, the liquid chemical C supplied to the substrate W may be collected through a discharge portion 51 provided in the chamber 50. The discharge portion 51 forms a discharge path for the contaminants such as fume or foreign substances caused by the heating in the liquid chemical C generated in the single wafer type wet etching or cleaning process according to the contact of the substrate W and the liquid chemical C.

A separate suction force is provided to the discharge portion 51, and thereby may suck and discharge the contaminants. The discharge portion 51 may be formed along the edge of the substrate W seated on the chamber 50.

Here, the radiant energy input unit 15 is separately arranged on the upper side of the substrate W and the nozzle 55 is separately arranged on the lower side of the substrate W, so that the influence on the scattering and interference of light with respect to the liquid chemical C may be minimized, and thereby an error of the calculated calculation temperature may be suppressed or prevented, resulting in minimizing an error range of the calculation temperature.

In addition, by the arrangement of the radiant energy input unit 15 and the nozzle 55, the liquid chemical C of room temperature may be supplied to the lower surface of the substrate W in the form of mist, and the single wafer type wet etching or cleaning process may be performed even at a high temperature of the boiling point or higher of the liquid chemical C.

In addition, even in a state in which the liquid chemical C is injected, there is no heat loss according to the single wafer type wet etching or cleaning process, and a temperature condition optimized by simply adjusting a temperature required for the single wafer type wet etching or cleaning process may be maintained.

One or more nozzles 55, liquid chemical lines 58, and liquid chemical tanks 59 may be provided in response to the type of the liquid chemical C. In this instance, the liquid chemical C of the liquid chemical tank 59 may be heated to be equal to or less than the process temperature.

Consequently, the substrate processing apparatus according to an embodiment of the present invention may monitor a change in the temperature of the liquid chemical C in a state in which the liquid chemical C is brought into contact with the substrate W through a monitoring function as well as adjusting the temperature of the liquid chemical C which is brought into contact with the substrate W, and thereby may find a problem in the single wafer type wet etching or cleaning process and check the etching or cleaning state of the substrate W.

In addition, the substrate processing apparatus according to an embodiment of the present invention may be spaced apart from the upper surface of the substrate W to adjust the temperature of the substrate W or the liquid chemical C which is brought into contact with the substrate W through the heater 20, and thereby may supply the liquid chemical C of room temperature to the lower surface of the substrate W in the form of mist and perform the single wafer type wet etching or cleaning process even at a high temperature of the boiling point or higher of the liquid chemical C.

In addition, in the substrate processing apparatus according to an embodiment of the present invention, there is no heat loss according to the single wafer type wet etching or cleaning process even in a state in which the liquid chemical C is injected, and a temperature condition optimized by simply adjusting the temperature required for the single wafer type wet etching or cleaning process may be maintained.

Hereinafter, a substrate processing apparatus according to another embodiment of the present invention will be described.

In the substrate processing apparatus according to another embodiment of the present invention, the same reference numeral is given to the same configuration as that of the substrate processing apparatus according to an embodiment of the present invention, and description thereof will be omitted.

Figure 6:
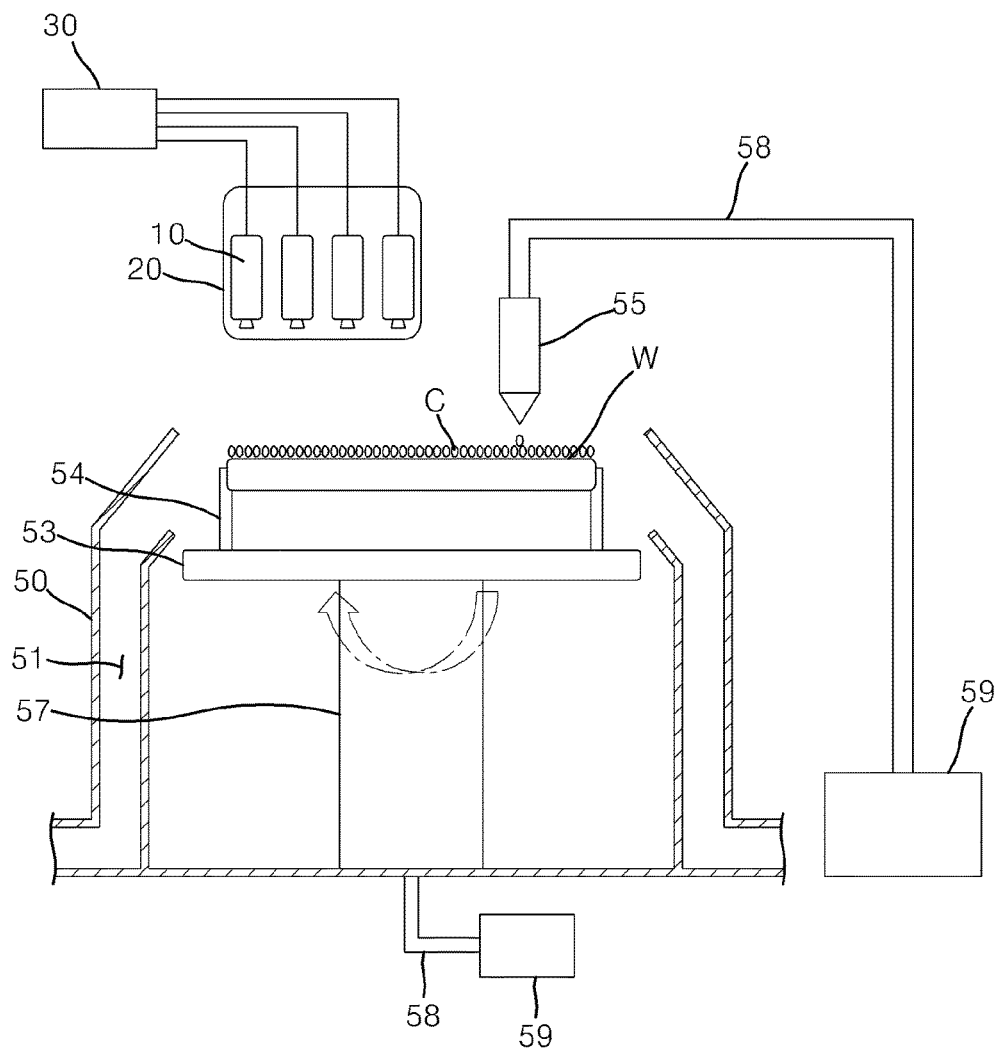
FIG. 6 illustrates a substrate processing apparatus according to another embodiment of the present invention.

FIG. 6 illustrates a substrate processing apparatus according to another embodiment of the present invention.

Referring to FIG. 6, in the substrate processing apparatus according to another embodiment of the present invention, the position of the nozzle 55 is changed.

More specifically, the radiant energy input unit 15 and the nozzle 55 are separately arranged on the upper side of the substrate W, and therefore contaminants generated in the single wafer type wet etching or cleaning process may be easily removed, contamination caused by the scattering of the liquid chemical C may be suppressed, and the consumption of the liquid chemical C may be reduced, compared to when the nozzle 55 is provided on the upper side of the substrate W.

In addition, by the arrangement of the radiant energy input unit 15 and the nozzle 55, the liquid chemical C of room temperature may be supplied to the upper surface of the substrate W in the form of liquid, and the single wafer type wet etching or cleaning process may be performed even at a high temperature of the boiling point or higher of the liquid chemical C.

In addition, even in a state in which the liquid chemical C is injected, there is no heat loss according to the single wafer type wet etching or cleaning process, and a temperature condition optimized by simply adjusting a temperature required for the single wafer type wet etching or cleaning process may be maintained.

Hereinafter, a substrate processing method according to an embodiment of the present invention will be described.

Figure 7:
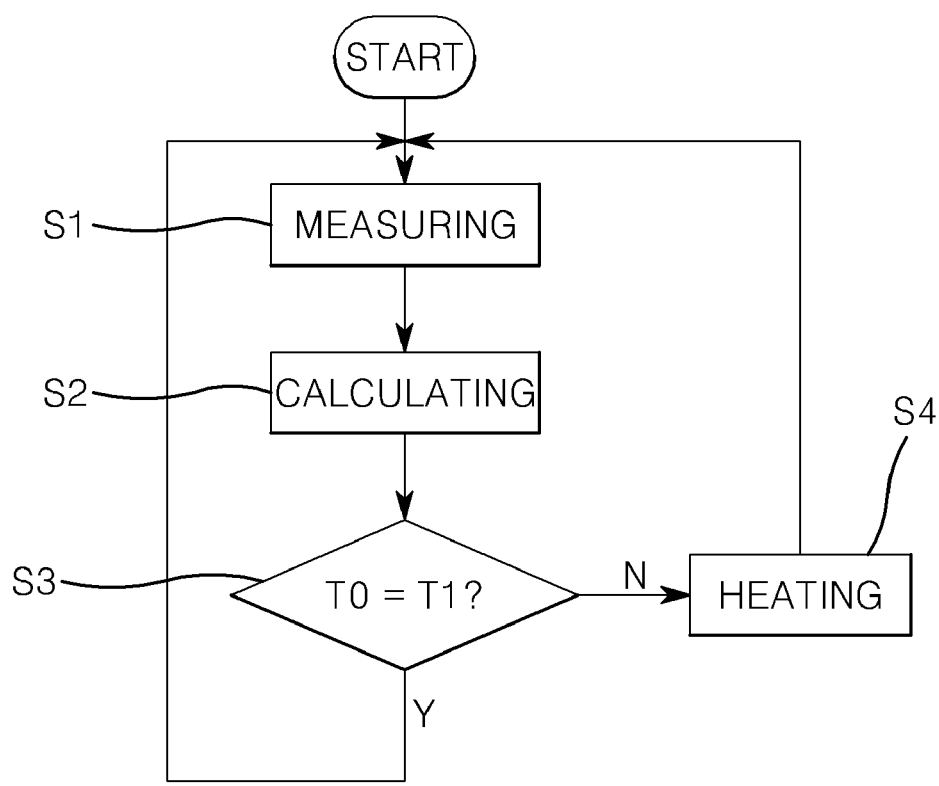
FIG. 7 is a flowchart illustrating a substrate processing method according to an embodiment of the present invention.
Figure 8:
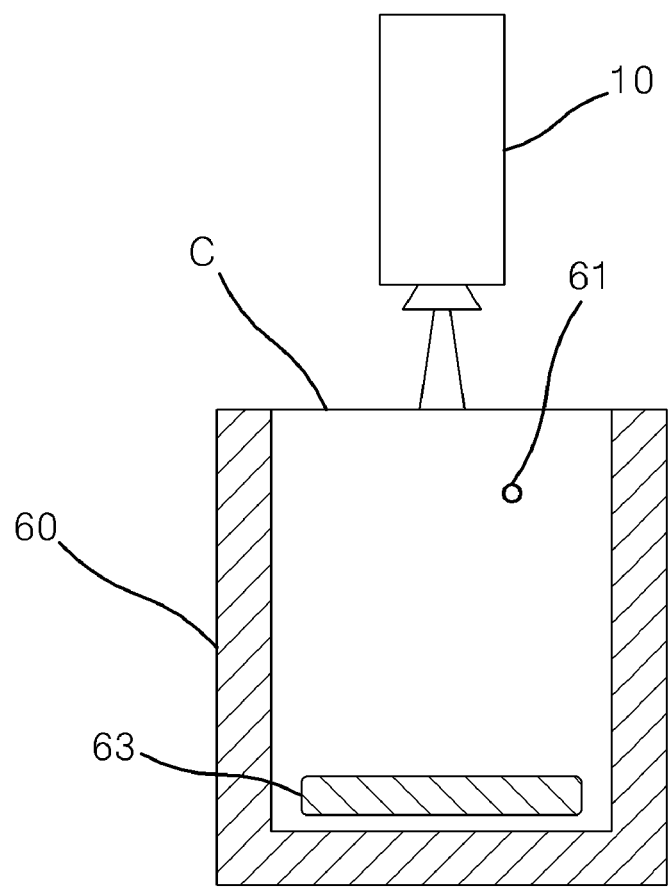
FIG. 8 is a structural diagram illustrating an experimental apparatus for detecting the characteristics of a pyrometer with respect to a liquid chemical in a substrate processing method according to an embodiment of the present invention.
Figure 9:
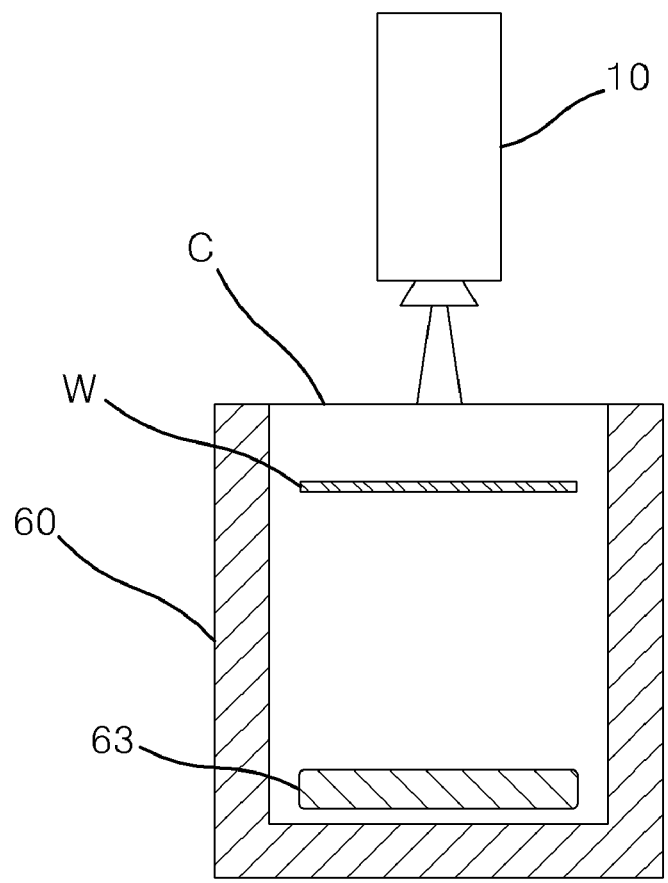
FIG. 9 is a structural diagram illustrating an experimental apparatus for detecting the characteristics of a pyrometer with respect to a substrate immersed in a liquid chemical in a substrate processing method according to an embodiment of the present invention.
Figure 10:
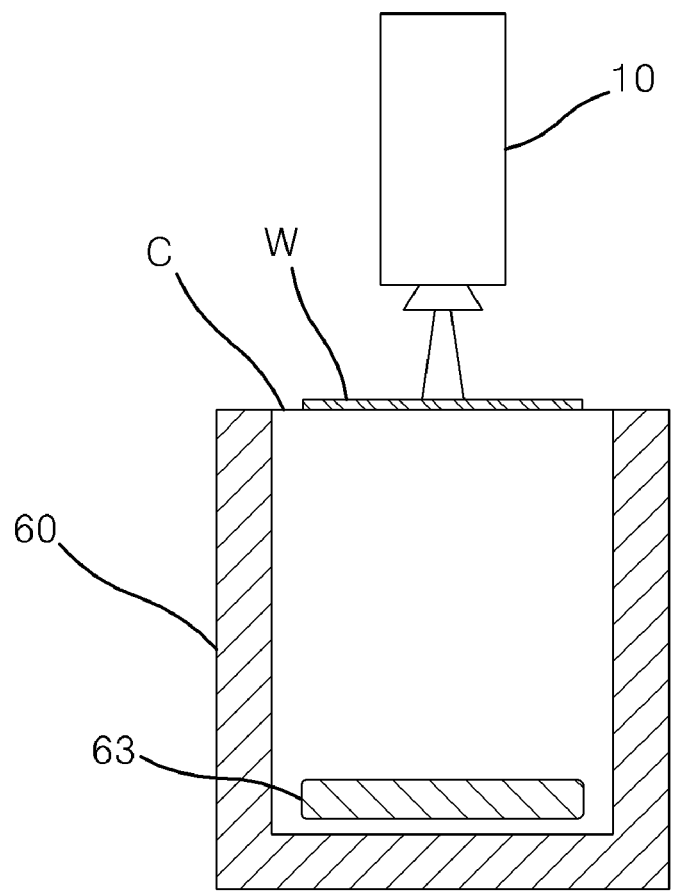
FIG. 10 is a structural diagram illustrating an experimental apparatus for detecting the characteristics of a pyrometer with respect to an interface of a substrate and a liquid chemical in a substrate processing method according to an embodiment of the present invention.
Figure 11:
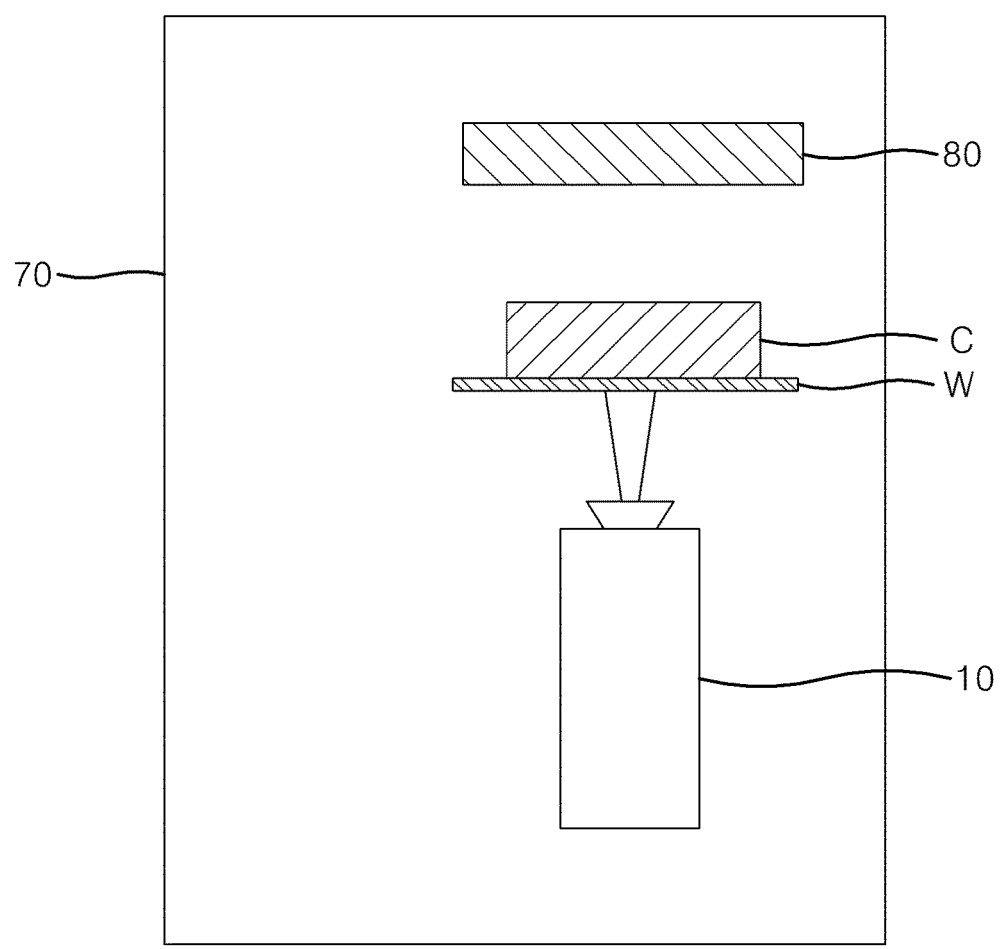
FIG. 11 is a structural diagram illustrating an experimental apparatus for confirming the characteristics of a pyrometer in a substrate processing method according to an embodiment of the present invention.

FIG. 7 is a flowchart illustrating a substrate processing method according to an embodiment of the present invention, FIG. 8 is a structural diagram illustrating an experimental apparatus for detecting the characteristics of a pyrometer with respect to a liquid chemical in a substrate processing method according to an embodiment of the present invention, FIG. 9 is a structural diagram illustrating an experimental apparatus for detecting the characteristics of a pyrometer with respect to a substrate immersed in a liquid chemical in a substrate processing method according to an embodiment of the present invention, FIG. 10 is a structural diagram illustrating an experimental apparatus for detecting the characteristics of a pyrometer with respect to an interface of a substrate and a liquid chemical in a substrate processing method according to an embodiment of the present invention, and FIG. 11 is a structural diagram illustrating an experimental apparatus for confirming the characteristics of a pyrometer in a substrate processing method according to an embodiment of the present invention.

Referring to FIGS. 7 to 11, it is possible to measure radiant energy radiating from the liquid chemical C or the interface at which the liquid chemical C and the substrate W are brought into contact with each other.

First, an experiment for deriving characteristics of the pyrometer 10 was performed with respect to the substrate W.

In the present experiment, a silicon wafer was used as the substrate W. In addition, as the substrate W, silicon carbide (SiC), sapphire wafer, quartz, or the like may be used.

For the present experiment, in the experimental group, the pyrometer 10 was separately arranged on one side of the substrate W, a blackbody and a heating heater 63 were sequentially arranged separately on the other side of the substrate W, and then radiant energy was measured according to the heating temperature while heating the blackbody through the heating heater 63.

Next, in the corresponding control group, the pyrometer 10 was separately arranged on one side of the blackbody, the heating heater 63 was separately arranged on the other side of the blackbody, and then the radiant energy was measured according to the heating temperature while heating the blackbody through the heating heater 63 in the same manner as that in the experimental group.

Based on the experimental results, in the experimental group and the control group, substantially the same radiant energy was measured, and thereby characteristics of the substrate W through which infrared wavelengths are transmitted are shown.

In addition, the substrate W was disposed between the pyrometer 10 and the heating heater 63 after the type of the substrate W was changed, and then transmission characteristics were examined. Based on the examination result of transmission characteristics, characteristics of the substrate W through which infrared wavelengths are transmitted are shown even when film qualities or film thicknesses of the substrates W are different.

In addition, an experiment for deriving characteristics of the pyrometer 10 was performed with respect to the liquid chemical C.

In the present experiment, phosphoric acid of 85 wt % was used as the liquid chemical C.

For the present experiment, a test water tank 60 was filled with the liquid chemical C, and the pyrometer 10 was separately arranged from the surface of the liquid chemical C. Next, the liquid chemical C was heated through the heating heater 63, and the emissivity of the liquid chemical C was measured while changing the temperature of the liquid chemical C. In this instance, it is possible to measure the temperature of the liquid chemical C by immersing a thermocouple 61 in the liquid chemical C.

Based on the experimental results, it was confirmed that the emissivity of the liquid chemical C was kept substantially constant, regardless of the temperature.

In addition, even in the characteristics of the pyrometer 10 with respect to the liquid chemical C used in a photoresist removal process, the characteristics in which the emissivity of the liquid chemical C was kept substantially constant, regardless of the temperature are shown.

In addition, an experiment for deriving characteristics of the pyrometer 10 was performed with respect to the substrate W immersed in the liquid chemical C.

For the present experiment, the test water tank 60 was filled with the liquid chemical C, and the pyrometer 10 was separately arranged from the surface of the liquid chemical C.

Next, the liquid chemical C was heated through the heating heater 63, and the temperature of the substrate W according to a set temperature of the liquid chemical C and the emissivity of the liquid chemical C were measured while moving the substrate W immersed in the liquid chemical C from the surface of the liquid chemical C for each depth. Here, the measurement results are shown in the following Table 1.

In this instance, the thermocouple 61 is connected to the substrate W to measure the temperature of the substrate W.

Based on the experimental results, there is a value difference with the measurement result obtained by measuring only the liquid chemical C, but characteristics in which the temperature of the substrate W and the emissivity of the liquid chemical C are kept substantially constant are shown.

TABLE 1

| Depth of substrate (mm) | | Set temperature (° C.) of liquid chemical | | | | | | |
|---|---|---|---|---|---|---|---|---|
| | | 50 | 60 | 70 | 80 | 90 | 100 | 110 |
| −1 | Temperature of substrate (° C.) | — | — | 74.0 | 83.2 | 94.4 | 108.0 | 117.8 |
| | Emissivity | — | — | 0.77 | 0.77 | 0.77 | 0.76 | 0.75 |
| −2 | Temperature of substrate (° C.) | — | — | 74.4 | 85.0 | 95.0 | 107.5 | 118.3 |
| | Emissivity | — | — | 0.77 | 0.77 | 0.76 | 0.76 | 0.75 |
| −5 | Temperature of substrate (° C.) | — | — | 76.2 | 86.0 | 96.0 | 105.3 | 116.6 |
| | Emissivity | — | — | 0.77 | 0.77 | 0.77 | 0.77 | 0.77 |

TABLE 1-continued

| Depth of substrate (mm) | | Set temperature (° C.) of liquid chemical | | | | | | |
|---|---|---|---|---|---|---|---|---|
| | | 50 | 60 | 70 | 80 | 90 | 100 | 110 |
| −10 | Temperature of substrate (° C.) | 53.0 | 64.0 | 76.5 | 86.1 | 96.3 | 107.3 | 120.0 |
| | Emissivity | 0.79 | 0.77 | 0.77 | 0.77 | 0.77 | 0.76 | 0.76 |
| −20 | Temperature of substrate (° C.) | 53.0 | 64.0 | — | — | — | — | — |
| | Emissivity | 0.77 | 0.78 | — | — | — | — | — |

In addition, an experiment for deriving characteristics of the pyrometer 10 was performed with respect to the interface of the substrate W and the liquid chemical C.

Here, phosphoric acid of 85 wt % was used as the liquid chemical C. Here, when a ratio of the liquid chemical C to pure water is 1:2, the phosphoric acid of approximately 39 wt % is contained, and when a ratio of the liquid chemical C to pure water is 1:1, the phosphoric acid of approximately 53 wt % is contained.

For the present experiment, the test water tank 60 was filled with the liquid chemical C, and the pyrometer 10 was separately arranged from the surface of the liquid chemical C.

Next, the liquid chemical C was heated through the heating heater 63, and the temperature of the substrate W according to a set temperature of the liquid chemical C and the emissivity of the liquid chemical C were measured while changing the type of the liquid chemical C in a state in which the substrate W is brought into contact with the surface of the liquid chemical C. Here, the measurement results are shown in the following Table 2.

In this instance, the thermocouple 61 is connected to the substrate W to measure the temperature of the substrate W.

Based on the experimental results, the emissivity was changed as the concentration of the liquid chemical C was changed, but characteristics in which the emissivity is kept substantially constant are shown with respect to the same concentration.

TABLE 2

| Liquid chemical (liquid chemical:pure water) | | Set temperature (° C.) of liquid chemical | | | | | |
|---|---|---|---|---|---|---|---|
| | | 60 | 70 | 80 | 90 | 100 | 110 |
| Pure water 100% | Temperature of substrate (° C.) | 62 | 72 | — | — | — | — |
| | Emissivity | 0.76 | 0.76 | — | — | — | — |
| 1:2 | Temperature of substrate (° C.) | — | 71.8 | 82.4 | — | — | — |
| | Emissivity | — | 0.73 | 0.73 | — | — | — |
| 1:1 | Temperature of substrate (° C.) | — | 69.9 | 82.1 | — | — | — |
| | Emissivity | — | 0.72 | 0.72 | — | — | — |
| Liquid chemical 100% | Temperature of substrate (° C.) | — | 73.0 | 86.0 | 95.5 | 108.3 | 118.3 |
| | Emissivity | — | 0.68 | 0.68 | 0.67 | 0.67 | 0.67 |

In addition, an experiment for deriving characteristics of the pyrometer 10 was performed with respect to a membrane change.

For the present experiment, a significantly small amount (thickness of less than 0.5 mm) of the liquid chemical C was brought into contact with the substrate W within a test housing 70, a test block 80 was separately arranged toward the interface at which the substrate W and the liquid chemical C are in contact with each other, and the pyrometer 10 was separately arranged on the opposite surface of the interface.

Next, the temperature concerning whether the test block 80 is arranged and whether the liquid chemical C is brought contact with the substrate W was measured. In this instance, the thermocouple 61 is connected to the substrate W to measure the temperature of the substrate W.

Based on the experimental results, in a state in which the liquid chemical C is brought into contact with the substrate W, characteristics in which the temperature was kept substantially constant regardless of whether the test block 80 is arranged are shown. In addition, in a state in which the liquid chemical C is removed, characteristics in which the temperature was changed according to whether the test block 80 is arranged are shown.

The summary of the experimental results is shown as below.

First, characteristics of the substrate W through which infrared wavelengths are transmitted in a room temperature region are shown.

Second, characteristics of the substrate W through which infrared wavelengths are transmitted even when other substances are deposited on the substrate W are shown.

Third, the liquid chemical C with the same concentration has substantially the same emissivity regardless of the temperature of the liquid chemical C and the amount of the liquid chemical C.

Fourth, even when a significantly small amount of the liquid chemical C is present at the measurement point, characteristics of infrared irradiation are shown.

Based on the above-described experimental results, the substrate processing method according to an embodiment of the present invention includes a measurement operation S1 and a calculation operation S2.

In the measurement operation S1, the substrate processing method measures radiant energy radiating from the liquid chemical C which is brought into contact with the substrate W or from the interface at which the substrate W and the liquid chemical C are in contact with each other. Here, in the measurement operation S1, the substrate processing method measures the radiant energy radiating from the liquid chemical C or the interface through the pyrometer 10, and inputs the measured radiant energy to the radiant energy input unit 15.

In the measurement operation S1, the substrate processing method may separately measure emissivity of the liquid chemical C which is brought into contact with the substrate W and emissivity at the interface at which the substrate W and the liquid chemical C are in contact with each other, and input the measured emissivity to the emissivity setting unit 11.

In the calculation operation S2, the substrate processing method calculates the calculation temperature of the liquid chemical C which is brought into contact with the substrate or the calculation temperature of the interface, using the radiant energy and the emissivity of the liquid chemical C which are measured in the measurement operation S1.

Here, in the calculation operation S2, the substrate processing method may calculate the calculation temperature using an absolute temperature T calculated according to the following Equation 2.

$$E(\lambda, T) = \frac{\varepsilon C_1}{\lambda^5 \left(e^{\frac{C_2}{\lambda T}} - 1\right)} \quad \text{[Equation 2]}$$

In Equation 2, $C1 = 2\pi hc^2 = 3.74 \times 10^{-16}$ W/m² is satisfied, and $$C2 = \frac{hc}{k} = 1.44 \times 10^{-2} \text{ mK}$$

is satisfied.

Here, E ($\lambda$,T) denotes radiant energy measured through the measurement operation S1, $\lambda$ denotes an infrared wavelength set in advance, $\varepsilon$ denotes emissivity of the liquid chemical C, T denotes an absolute temperature, h denotes a Plank constant, c denotes a speed of light, and k denotes a Boltzmann constant.

Thus, by converting the calculated absolute temperature T into degrees Celsius or degrees Fahrenheit, it is possible to accurately measure the calculation temperature.

In this instance, the infrared wavelength may be set in advance to be more than 4 μm and 30 μm or less.

The radiant energy emitted from a material follows the plank's law, and peak wavelengths move to long wavelengths along with a reduction in the temperature.

When the temperature of the liquid chemical C is 25 degrees Celsius (room temperature region), a wavelength capable of measuring radiant energy of 1 W/(m²)(sr)(μm) or more is in a range of more than 4 μm and 30 μm or less, and the peak wavelength is 10 μm.

Here, it is difficult to measure the radiant energy in the wavelengths of 4 μm or less or more than 30 μm, and therefore the infrared wavelength may be set in advance to be more than 4 μm and 30 μm or less.

More specifically, the infrared wavelength may be set in advance to be 5 μm or more and less than 25 μm. In this instance, in the measurement operation S1, the radiant energy of 2 W/(m²)(sr)(μm) or more may be measured.

In addition, the infrared wavelength may be set in advance to be 6 μm or more and less than 23 μm. In this instance, in the measurement operation S1, the radiant energy of 3 W/(m²)(sr)(μm) or more may be measured.

In addition, the infrared wavelength may be set in advance to be 6 μm or more and less than 19 μm. In this instance, in the measurement operation S1, the radiant energy of 4 W/(m²)(sr)(μm) or more may be measured.

In addition, the infrared wavelength may be set in advance to be more than 6 μm and less than 18 μm. In this instance, in the measurement operation S1, the radiant energy of 5 W/(m²)(sr)(μm) or more may be measured.

In addition, the infrared wavelength may be set in advance to be 7 μm or more and 17 μm or less. In this instance, in the measurement operation S1, the radiant energy of 6 W/(m²)(sr)(μm) or more may be measured.

In addition, the infrared wavelength may be set in advance to be 7 μm or more and 16 μm or less. In this instance, in the measurement operation S1, the radiant energy of 7 W/(m²)(sr)(μm) or more may be measured.

In addition, the infrared wavelength may be set in advance to be 8 μm or more and less than 14 μm. In this instance, in the measurement operation S1, the radiant energy of 8 W/(m²)(sr)(μm) or more may be measured.

In addition, the infrared wavelength may be set in advance to be 9 μm or more and 11 μm or less. In this instance, in the measurement operation S1, the radiant energy of 9 W/(m²)(sr)(μm) or more may be measured.

The substrate processing method according to an embodiment of the present invention may further include a comparison operation S3.

In the comparison operation S3, the substrate processing method compares a process temperature set in advance in order to perform processing such as etching or cleaning the substrate W and the calculation temperature. In the comparison operation S3, the substrate processing method may compare the process temperature and the calculation temperature by the controller 33 of the control unit 30. The comparison operation S3 and a correction operation S4 may be performed through the heater 20 and the control unit 30.

The process temperature set in advance may be set as a temperature value according to processing conditions of the single wafer type wet etching or cleaning process, or set as a temperature range.

In the comparison operation S3, the signal transmitted from the signal converter 31 by the controller 33 may be displayed as a numerical value or stored as data for comparison, so that an operator can recognize the signal.

Based on the results obtained after the comparison operation S3, it is possible to adjust the temperature of the substrate W or the temperature of the liquid chemical C which is brought into contact with the substrate W.

More specifically, when the calculation temperature is included in the process temperature set in advance through the comparison operation S3, the measurement operation S1 is performed again.

In addition, when the calculation temperature is not included in the process temperature set in advance through the comparison operation S3, the substrate processing method further includes the correction operation S4.

In the correction operation S4, the substrate processing method heats the substrate W or the liquid chemical C which is brought into contact with the substrate W according to a difference value between the calculation temperature and the process temperature set in advance. In the correction operation S4, the substrate processing method may adjust a degree of heating the substrate W or the liquid chemical C which is brought into contact with the substrate W, by adjusting the output of the heater 20 according to the control signal transmitted from the control unit 30.

The above-described calculation temperature is a temperature calculated by the calculation unit 17, the process temperature is a theoretical temperature calculated in order to etch or clean the substrate W according to the type of the liquid chemical C, and the processing temperature is an actual temperature of the liquid chemical C which is brought into contact with the substrate W.

In the comparison operation S3 and the correction operation S4, the signal transmitted from the signal converter 31 by the controller 33 may be displayed as a numerical value, so that an operator can recognize the signal. In addition, in the comparison operation S3 and the correction operation S4, data for comparison may be stored.

In addition, in the comparison operation S3 and the correction operation S4, the substrate processing method may determine whether an abnormality in the corresponding process occurs according to the difference between the two signals, and notify the operator of the determination result.

In summary, the substrate processing method according to an embodiment of the present invention is as follows. The substrate W is rotated in the chamber 50, and the liquid chemical C is supplied to the substrate W. Here, processing conditions such as the type, the amount, the injection time, and the like of the liquid chemical C may be set in advance by an operator.

The radiant energy radiating from the liquid chemical C which is brought into contact with the substrate W or from the interface at which the substrate W and the liquid chemical C are in contact with each other is made incident onto the radiant energy input unit 15. According to an embodiment of the present invention, the radiant energy of an infrared region is used, and the incident radiant energy is an analog signal whose intensity continuously changes over time.

The calculation unit 17 calculates the calculation temperature through the radiant energy made incident onto the radiant energy input unit 15 and the emissivity set in advance by the emissivity setting unit 11. In this instance, the calculated calculation temperature is a digital signal, and converted into an analog signal through the signal converter 31 to be transmitted to the controller 33.

The controller 33 compares the process temperature set in advance and the transmitted calculation temperature, determines whether an abnormality in the corresponding process occurs, and notifies an operator of the determination result.

As described above, according to the substrate processing apparatus and substrate processing method, by directly measuring the temperature of the liquid chemical C which is brought into contact with the substrate W or the temperature of the interface, it is possible to accurately and efficiently manage the processing temperature.

In addition, according to the present invention, a temperature distribution change within the substrate W may be determined to be utilized as a basis for determining the cause of a reduction in the yield in the etching or cleaning process, and therefore process defects may be predicted.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

The invention claimed is:

1. A substrate processing apparatus comprising:
   an emissivity setting unit to which emissivity at a liquid chemical which is brought into contact with a substrate or emissivity at an interface at which the substrate and the liquid chemical are in contact with each other is input;
   a radiant energy input unit to which radiant energy radiating from the liquid chemical or the interface is input; and
   a calculation unit that calculates a calculation temperature of the liquid chemical or the interface based on the emissivity and the radiant energy,
   wherein the radiant energy input unit is provided to be spaced apart from the substrate on an opposite side in which the interface is positioned with respect to the substrate.

2. The substrate processing apparatus of claim 1, further comprising:
   a chamber that includes a table that is rotatably disposed, a support that supports the substrate in such a manner that the substrate is spaced apart from the table, and a nozzle that supplies the liquid chemical to the substrate.

3. The substrate processing apparatus of claim 2, wherein the nozzle is separately arranged on a lower side of the substrate.

4. The substrate processing apparatus of claim 2, further comprising:
   a control unit that compares a process temperature set in advance to etch or clean the substrate and the calculation temperature.

5. The substrate processing apparatus of claim 4, further comprising:
   a heater that is separately arranged on an upper side of the substrate, and heats the substrate or the liquid chemical which is brought into contact with the substrate, according to a signal of the control unit.

6. The substrate processing apparatus of claim 5, wherein
   the substrate is divided into a central region corresponding to a rotational center portion of the table, an edge region corresponding to an edge portion caused by the rotation of the table, and a variable region for partitioning between the central region and the edge region,
   the radiant energy input unit and the heater are respectively arranged in the central region, the edge region, and the variable region, and
   the control unit individually operates the heater in the central region, the edge region, and the variable region.

7. The substrate processing apparatus of claim 1, wherein the calculation unit calculates the calculation temperature using an absolute temperature calculated according to the following Equation 3, $$E(\lambda, T) = \frac{\varepsilon C_1}{\lambda^5 \left(e^{\frac{C_2}{\lambda T}} - 1\right)} \quad \text{[Equation 3]}$$

where $C1 = 2\pi hc^2 = 3.74 \times 10^{-16}$ W/m$^2$ is satisfied and $$C2 = \frac{hc}{k} = 1.44 \times 10^{-2} \text{ mK}$$

is satisfied, and
E ($\lambda$,T) denotes the radiant energy input to the radiant energy input unit, $\lambda$, denotes an infrared wavelength set in advance according to the radiant energy input unit, $\varepsilon$ denotes the emissivity at the liquid chemical or the interface, T denotes the absolute temperature, h denotes a Plank constant, c denotes a speed of light, and k denotes a Boltzmann constant.

8. The substrate processing apparatus of claim 1, wherein a pyrometer includes the emissivity setting unit, the radiant energy input unit, and the calculation unit so as to measure the calculation temperature, and is provided in an installation portion that is separately arranged on an upper side of the substrate.

9. The substrate processing apparatus of claim 1, further comprising:
 a protection unit that wraps and protects the radiant energy input unit.

10. A substrate processing method comprising:
 measuring radiant energy radiating from a liquid chemical which is brought into contact with a substrate or from an interface at which the substrate and the liquid chemical are in contact with each other; and
 calculating a calculation temperature of the liquid chemical which is brought into contact with the substrate or a calculation temperature of the interface based on the radiant energy measured in the measuring and emissivity at the liquid chemical or the interface,
 wherein the substrate processing method further comprises:
 comparing a process temperature set in advance so as to etch or clean the substrate and the calculation temperature calculated in the calculating,
 wherein, when the calculation temperature is included in the process temperature set in advance in the comparing, the measuring is performed.

11. The substrate processing method of claim 10, when the calculation temperature is not included in the process temperature set in advance in the comparing, further comprising:
 heating the substrate or the liquid chemical which is brought into contact with the substrate for correction according to a difference value between the calculation temperature and the process temperature set in advance.

12. A substrate processing method comprising:
 measuring radiant energy radiating from a liquid chemical which is brought into contact with a substrate or from an interface at which the substrate and the liquid chemical are in contact with each other; and
 calculating a calculation temperature of the liquid chemical which is brought into contact with the substrate or a calculation temperature of the interface based on the radiant energy measured in the measuring and emissivity at the liquid chemical or the interface,
 wherein the calculating calculates the calculation temperature using an absolute temperature T calculated according to the following Equation 4, $$E(\lambda, T) = \frac{\varepsilon C_1}{\lambda^5 \left(e^{\frac{C_2}{\lambda T}} - 1\right)} \quad \text{[Equation 4]}$$

where $$C_1 = 2\pi hc^2 = 3.74 \times 10^{-16} \text{ W/m}^2$$

is satisfied and $$C_2 = \frac{hc}{k} = 1.44 \times 10^{-2} \text{ mK}$$

is satisfied, and
 E $(\lambda, T)$ denotes the radiant energy measured in the measuring, $\lambda$, denotes an infrared wavelength set in advance according to a radiant energy input unit to which the radiant energy is input, $\varepsilon$ denotes the emissivity at the liquid chemical or the interface, T denotes the absolute temperature, h denotes a Plank constant, c denotes a speed of light, and k denotes a Boltzmann constant.

* * * * *